US011908907B2

(12) United States Patent
Wu et al.

(10) Patent No.: US 11,908,907 B2
(45) Date of Patent: Feb. 20, 2024

(54) VFET CONTACT FORMATION

(71) Applicant: INTERNATIONAL BUSINESS MACHINES CORPORATION, Armonk, NY (US)

(72) Inventors: Heng Wu, Guilderland, NY (US); Ruilong Xie, Niskayuna, NY (US); Tian Shen, Clifton Park, NY (US); Kai Zhao, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 17/118,853

(22) Filed: Dec. 11, 2020

(65) Prior Publication Data

US 2022/0190125 A1 Jun. 16, 2022

(51) Int. Cl.
  *H01L 29/417* (2006.01)
  *H01L 21/8238* (2006.01)
  *H01L 27/092* (2006.01)
  *H01L 29/78* (2006.01)
  *H01L 29/45* (2006.01)
  *H01L 29/66* (2006.01)

(52) U.S. Cl.
  CPC ............ *H01L 29/41741* (2013.01); *H01L 21/823814* (2013.01); *H01L 21/823871* (2013.01); *H01L 21/823885* (2013.01); *H01L 27/092* (2013.01); *H01L 29/45* (2013.01); *H01L 29/66666* (2013.01); *H01L 29/7827* (2013.01)

(58) Field of Classification Search
  CPC ......... H01L 27/092; H01L 21/823885; H01L 21/823814; H01L 21/823871; H01L 29/7827; H01L 29/66666; H01L 29/41741; H01L 29/45; H01L 21/823487; H01L 21/823475; H01L 21/823418; H01L 27/088; H01L 27/11556; H01L 27/11582; H10B 41/27; H10B 43/27
  See application file for complete search history.

(56) References Cited

U.S. PATENT DOCUMENTS

| 5,780,898 | A  | 7/1998  | Tamaki       |
|-----------|----|---------|--------------|
| 6,653,181 | B2 | 11/2003 | Hergenrother |
| 6,773,994 | B2 | 8/2004  | Chittipeddi  |
| 7,683,428 | B2 | 3/2010  | Chidambarrao |
| 8,039,893 | B2 | 10/2011 | Masuoka      |

(Continued)

FOREIGN PATENT DOCUMENTS

WO 2022122571 A1 6/2022

OTHER PUBLICATIONS

Notification of Transmittal of the International Search Report and the Written Opinion of the International Searching Authority, or the Declaration, dated Mar. 11, 2022, International application No. PCT/EP2021/084108, 14 pages.

*Primary Examiner* — Michael M Trinh
(74) *Attorney, Agent, or Firm* — L. Jeffrey Kelly

(57) ABSTRACT

An embodiment of the invention may include a Vertical Field Effect Transistor (VFET) structure, and method of making that structure, having a first VFET and a second VFET. The first VFET may include a single liner between a first source/drain epi and a contact. The second VFET may include two liners between a second source/drain epi and a contact. This may enable proper contact liner matching for differing VFET devices.

23 Claims, 7 Drawing Sheets

(56) References Cited

U.S. PATENT DOCUMENTS

| | | | |
|---|---|---|---|
| 9,177,810 B2 | 11/2015 | Basker | |
| 10,262,904 B2 | 4/2019 | Gluschenkov | |
| 2011/0303973 A1* | 12/2011 | Masuoka | H01L 29/66772 |
| | | | 257/329 |
| 2011/0303986 A1* | 12/2011 | Yang | H01L 29/0692 |
| | | | 257/E27.063 |
| 2014/0210011 A1 | 7/2014 | Baraskar | |
| 2015/0214058 A1 | 7/2015 | Basker | |
| 2016/0049480 A1 | 2/2016 | Chang | |
| 2017/0317177 A1 | 11/2017 | Mallela | |
| 2018/0005903 A1* | 1/2018 | Basker | H01L 21/76897 |
| 2018/0068903 A1* | 3/2018 | Adusumilli | H01L 29/161 |
| 2018/0277538 A1* | 9/2018 | Chang | H01L 21/823871 |
| 2018/0286869 A1* | 10/2018 | Zhang | H01L 21/823892 |
| 2019/0279913 A1* | 9/2019 | Gluschenkov | H01L 29/161 |
| 2020/0176611 A1 | 6/2020 | Lee | |
| 2021/0013108 A1* | 1/2021 | Wu | H01L 29/665 |

\* cited by examiner

VFET CONTACT FORMATION

BACKGROUND

The present invention relates to relates to the field of semiconductor devices, and more specifically, to contact formation of vertical field-effect transistors (VFETs).

VFETs have been pursued as a potential device option for scaling complementary metal-oxide semiconductors (CMOS) to the 5 nanometer (nm) node and beyond. As opposed to planar CMOS devices, VFETs are oriented vertically with a vertical fin or nanowire that extends upward from the substrate. The fin or nanowire forms the channel region of the transistor. A source region and a drain region are situated in electrical contact with the top and bottom ends of the channel region, while the gate is disposed on one or more of the fin or nanowire sidewalls. Thus, in VFETs the direction of the current flow between the source and drain regions is normal to the main surface of the substrate.

The nature of VFET is that it is not constrained by scaling law in the lateral direction thanks to the flexibility of the device to extend vertically.

BRIEF SUMMARY

An embodiment of the invention may include a Vertical Field Effect Transistor (VFET) structure having a first VFET and a second VFET. The first VFET may include a single liner between a first source/drain epi and a contact. The second VFET may include two liners between a second source/drain epi and a contact. This may enable proper contact liner matching for differing VFET devices.

The embodiment may further include the first VFET as a pFET and the second VFET as an nFET. This may enable proper contact liner matching for differing pFET and nFET devices.

The embodiment may further include a pFET liner located above a titanium liner above the second VFET. This may enable proper contact liner matching for differing pFET and nFET devices while minimizing process steps.

The embodiment may further include a top surface of the first source/drain epi below a top surface of the second source/drain epi. This may enable proper contact liner matching for differing pFET and nFET devices while minimizing process steps.

The embodiment may further include the titanium liner containing a pFET dopant. This may enable proper contact liner matching for differing pFET and nFET devices while minimizing process steps.

An embodiment of the invention may include a Vertical Field Effect Transistor (VFET) structure having a first VFET and a second VFET. The first VFET may include at least one liner between a first source/drain epi and a contact. The second VFET may include at least two liners between a second source/drain epi and a contact. This may enable proper contact liner matching for differing VFET devices. The number of liners above the second VFET is greater than the number of liners above the first VFET.

The embodiment may further include the first VFET as a pFET and the second VFET as an nFET. This may enable proper contact liner matching for differing pFET and nFET devices.

The embodiment may further include a pFET liner located above a titanium liner above the second VFET. This may enable proper contact liner matching for differing pFET and nFET devices while minimizing process steps.

The embodiment may further include a top surface of the first source/drain epi below a top surface of the second source/drain epi. This may enable proper contact liner matching for differing pFET and nFET devices while minimizing process steps.

The embodiment may further include the titanium liner containing a pFET dopant. This may enable proper contact liner matching for differing pFET and nFET devices while minimizing process steps.

An embodiment may include a method of forming a VFET structure. The method may include forming a first VFET with a first source/drain epi and a second VFET with a second source/drain epi. The method may include performing a first ion implantation on the second source/drain epi to form an implanted source/drain epi. The method may include selectively depositing a first liner on the implanted source/drain epi. The method may include performing a second blanket implantation. This may enable proper contact liner matching for differing devices.

The embodiment may further include the first VFET as a pFET and the second VFET as an nFET. This may enable proper contact liner matching for differing pFET and nFET devices.

The embodiment may further include a pFET liner located above a titanium liner above the second VFET. This may enable proper contact liner matching for differing pFET and nFET devices while minimizing process steps.

The embodiment may further include a top surface of the first source/drain epi below a top surface of the second source/drain epi. This may enable proper contact liner matching for differing pFET and nFET devices while minimizing process steps.

The embodiment may further include the titanium liner containing a pFET dopant. This may enable proper contact liner matching for differing pFET and nFET devices while minimizing process steps.

An embodiment may include a method of forming a VFET structure. The method may include forming a first VFET with a first source/drain epi and a second VFET with a second source/drain epi. The method may include forming a cap over the first source/drain epi. The method may include performing a first ion implantation on the second source/drain epi to form an implanted source/drain epi, and where the cap block ion implantation into the first source/drain epi. The method may include selectively depositing a first liner on the implanted source/drain epi. The method may include performing a second blanket implantation. This may enable proper contact liner matching for differing devices.

The embodiment may further include the first VFET as a pFET and the second VFET as an nFET. This may enable proper contact liner matching for differing pFET and nFET devices.

The embodiment may further include a pFET liner located above a titanium liner above the second VFET. This may enable proper contact liner matching for differing pFET and nFET devices while minimizing process steps.

The embodiment may further include a top surface of the first source/drain epi below a top surface of the second source/drain epi. This may enable proper contact liner matching for differing pFET and nFET devices while minimizing process steps.

The embodiment may further include the titanium liner containing a pFET dopant. This may enable proper contact liner matching for differing pFET and nFET devices while minimizing process steps.

In the embodiment, forming the cap may include depositing a dielectric above the first source/drain epi and planarizing the dielectric so a top surface of the cap is substantially coplanar to a top surface of the second source/drain epi. This may enable proper contact liner matching for differing pFET and nFET devices while minimizing process steps.

Figure 1:
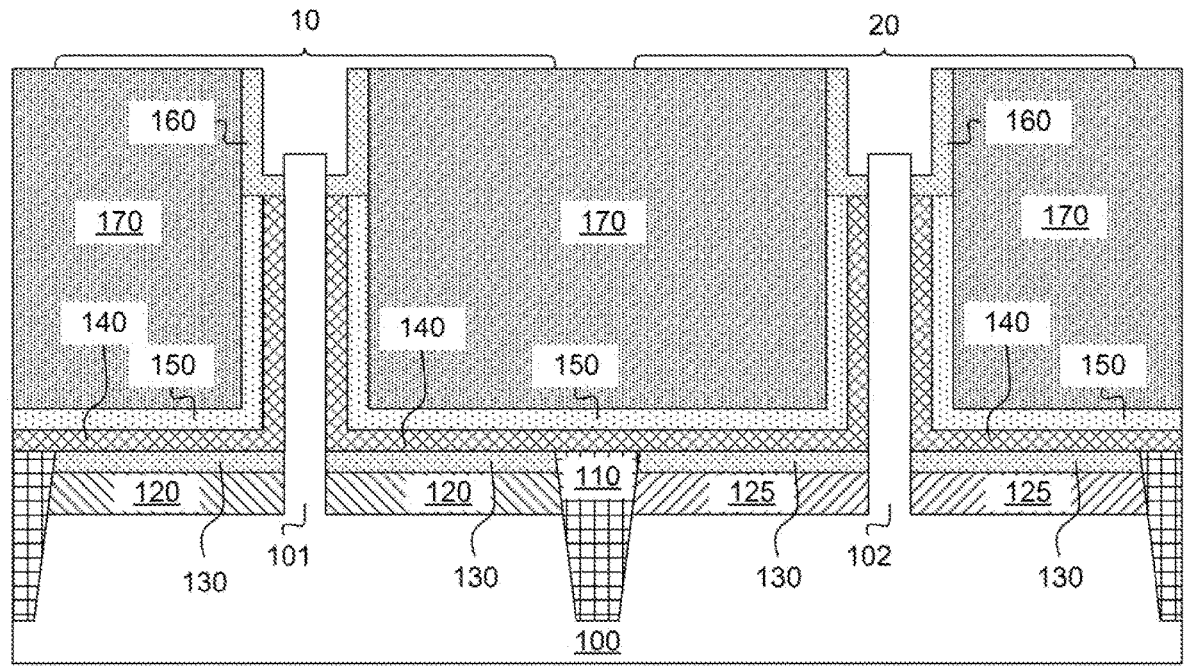
FIG. 1 depicts two VFET structures in a first region and a second region prior to forming top contacts, according to an example embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Example embodiments now will be described more fully herein with reference to the accompanying drawings, in which example embodiments are shown. This disclosure may, however, be embodied in many different forms and should not be construed as limited to the example embodiments set forth herein. Rather, these example embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The ability to select proper silicides and contact liners for source/drain epitaxial regions is a key component to tuning the contact resistance of such devices. Previous techniques may enable such selection of liners, while having the additional cost of additional lithographic steps. The proposed method, and resulting structure, enable proper silicide formation for nFET and pFET devices, where the materials for one type of device do not adversely cross-contaminate the other device, while also minimizing additional lithographic steps.

Referring to FIG. 1, two VFET structures, a pFET in a first region 10 and a nFET in a second region 20, are depicted prior to forming top contacts, according to an example embodiment. The pFET structure in the first region 10 includes a first fin 101 located on a substrate 100, and the nFET structure in the second region 20 includes a second fin 102 located on the substrate 100. The first region 10 and second region 20 are separated by an STI 110. Located on the surface of the substrate 100, and in contact with the first fin 101, in the first region 10 is a pFET source/drain 120. Located on the surface of the substrate 100, and in contact with the second fin 102, in the second region 20 is a nFET source/drain 125. A bottom spacer 130 may be located above the pFET source/drain 120 and nFET source/drain 125. A gate stack 140 may be located in contact with the first fin 101 and second fin 102. A protective cap 150 may be located above the gate stack 140, and a first ILD 170 may fill the rest of the level. Trenches formed in the ILD 170 may expose a top surface of first fin 101 and second fin 102. A top spacer 160 may be located in the trenches, while still exposing a portion the first fin 101 and the second fin 102.

The first fin 101 and second fin 102 may be formed from a top layer of substrate 100. According to an example embodiment, substrate 100 is a bulk semiconductor wafer, such as a bulk silicon (Si), bulk germanium (Ge), and/or bulk III-V semiconductor wafer. Alternatively, substrate 100 can be a semiconductor-on-insulator (SOI) wafer. SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 100 may already have pre-built structures (not shown) such as transistors, diodes, capacitors, resistors, interconnects, wiring, etc.

Shallow trench isolation (STI) 110 are frequently used in semiconductor technology to separate active regions within the substrate 100 and prevent electric current leakage between adjacent components. The process of forming the STI 110 is well known in the art, and generally include etching the substrate 100 to create recesses that may later be filled with an insulator material using any deposition method known in the art. In some embodiments, the STI region 108 may consist of any low-k dielectric material including, but not limited to, silicon nitride, silicon oxide, silicon oxynitride and fluoride-doped silicate glass.

The pFET source/drain 120 and nFET source drain 125 may be formed from different epitaxial materials. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor. The dopant concentration in the bottom S/D region 106 can range from $1\times10^{19}$ cm$^{-3}$ to $2\times10^{21}$ cm$^{-3}$, or preferably between $2\times10^{20}$ cm$^{-3}$ and $1\times10^{21}$ cm$^{-3}$.

The bottom spacer 130 can include a dielectric material, such as, for example, SiN, SiC, SiOC, SiCN, BN, SiBN, SiBCN, SiOCN, SiOxNy, and combinations thereof. The dielectric material can be a low-k material having a dielectric constant less than about 7, less than about 5, or even less than about 2.5. The bottom spacer 130 can be formed using combinations of known deposition and etching processes, such as, for example, chemical vapor deposition (CVD), plasma-enhanced chemical vapor deposition (PECVD), atomic layer deposition (ALD), physical vapor deposition (PVD), chemical solution deposition, and etching processes including reactive ion etch (RIE), wet etch, or isotropic vapor phased dry etch.

As illustrated in the figure, the gate stack 140 is formed in direct contact with the fins 101/102. For ease of illustration, the gate stack 140 is depicted as only one layer. However, as known by those skilled in the art, the gate stack 140 can include a gate dielectric and a gate conductor/metal (e.g., a work function metal (WFM)) deposited over the bottom spacer 130 and adjacent to a portion of the fins 101/102. In some embodiments, the gate stack 140 is deposited by ALD.

The gate dielectric (not shown) can be formed from one or more gate dielectric films. The gate dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric films can further include dopants such as, for example, lanthanum and aluminum. The gate dielectric films can be formed by suitable deposition processes, for example, CVD, PECVD, ALD, PVD, chemical solution deposition, or other like processes. The thickness of the gate dielectric films can vary depending on the deposition process as well as the composition and number of high-k dielectric materials used.

The gate conductor (not shown) in the gate stack 140 can include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the gate conductor can be a WFM deposited over the gate dielectric films by a suitable deposition process, for example, CVD, PECVD, PVD, plating, thermal or e-beam evaporation, and sputtering. The type of WFM depends on the type of transistor and can differ between n-FET and p-FET devices. P-type WFMs include compositions such as titanium nitride (TiN), ruthenium, palladium, platinum, cobalt, nickel, and conductive metal oxides, or any combination thereof. N-type WFMs include compositions such as titanium carbide (TiC), titanium aluminum carbide (TiAlC), hafnium, zirconium, titanium, tantalum, aluminum, metal carbides (e.g., hafnium carbide, zirconium carbide, titanium carbide, and aluminum carbide), aluminides, or any combination thereof. The gate conductor can further include a tungsten (W), titanium (Ti), aluminum (Al), cobalt (Co), or nickel (Ni) material over the WFM layer of the gate conductor. The gate conductor can be deposited by a suitable deposition process, for example, CVD, PECVD, PVD, plating, thermal or e-beam evaporation, and sputtering.

In this embodiment, the gate stack 140 is conformally deposited. After deposition of the gate stack 140, a patterning process is conducted to etch the unwanted gate stack 140.

The protective cap 150 may be located above the gate stack 140 and serve as a protective layer on the gate stack 140. In an example embodiment, the protective cap may be SiN.

The first ILD 170 is formed to fill voids between gate structures and other existing devices. The first ILD 170 may be formed by, for example, CVD of a dielectric material. Non-limiting examples of dielectric materials to form the first ILD 170 may include silicon oxide, silicon nitride, hydrogenated silicon carbon oxide, silicon based low-k dielectrics, flowable oxides, porous dielectrics, or organic dielectrics including porous organic dielectrics. After deposition of the first ILD 170, forming a trench using lithographic and etching techniques may be performed to expose a top surface of the first fin 101 and second fin 102.

The top spacer 160 can include a dielectric material, such as, for example, SiN, SiC, SiOC, SiCN, BN, SiBN, SiBCN, SiOCN, SiOxNy, and combinations thereof. The dielectric material can be a low-k material having a dielectric constant less than about 7, less than about 5, or even less than about 2.5. The bottom spacer 160 can be formed using combinations of known deposition and etching processes, such as, for example, chemical vapor deposition (CVD), plasma-enhanced chemical vapor deposition (PECVD), atomic layer deposition (ALD), physical vapor deposition (PVD), chemical solution deposition, and etching processes including reactive ion etch (RIE), wet etch, or isotropic vapor phased dry etch. Following deposition, a chemical mechanical polishing (CMP) process is conducted to remove excess dielectric from a top surface of first ILD 170.

Figure 2:
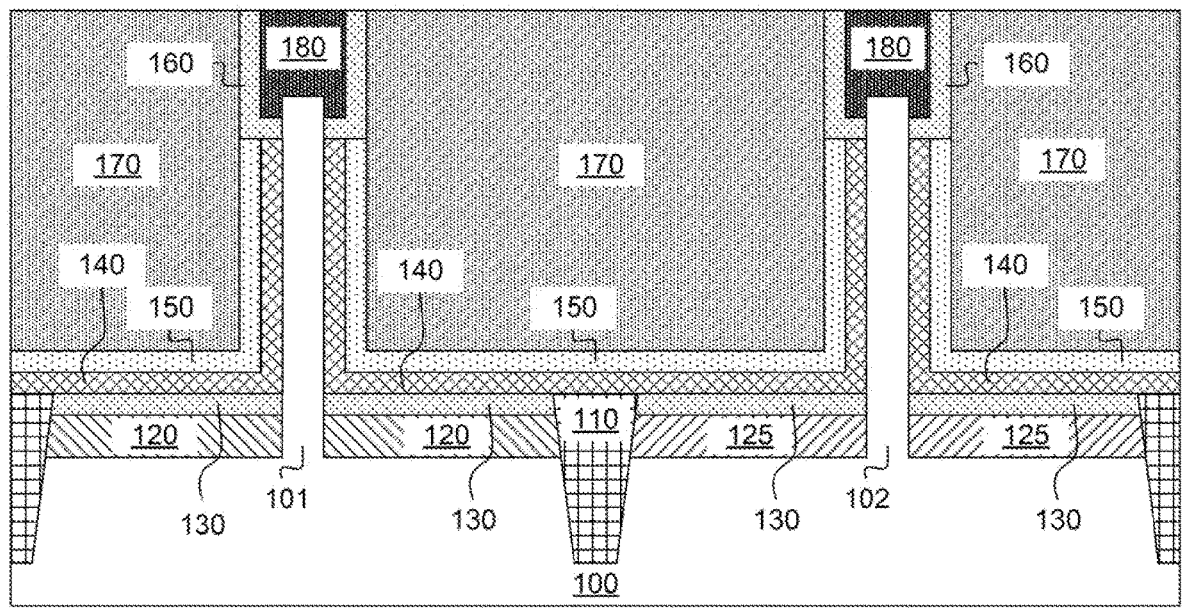
FIG. 2 depicts two VFET structures following deposition of a dummy contact, according to an example embodiment.

Referring to FIG. 2, deposition of a dummy contact 180 above the VFET structures may occur, according to an example embodiment. In such embodiments, the dummy contact 180 may be made of any suitable sacrificial material, for example, amorphous or polycrystalline silicon or amorphous Carbon. A dummy layer may be deposited by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD). Following deposition, a chemical mechanical polishing (CMP) process is conducted to remove excess dielectric from a top surface of first ILD 170, so that the only portion of the dummy layer remaining is dummy contact 180.

Figure 3:
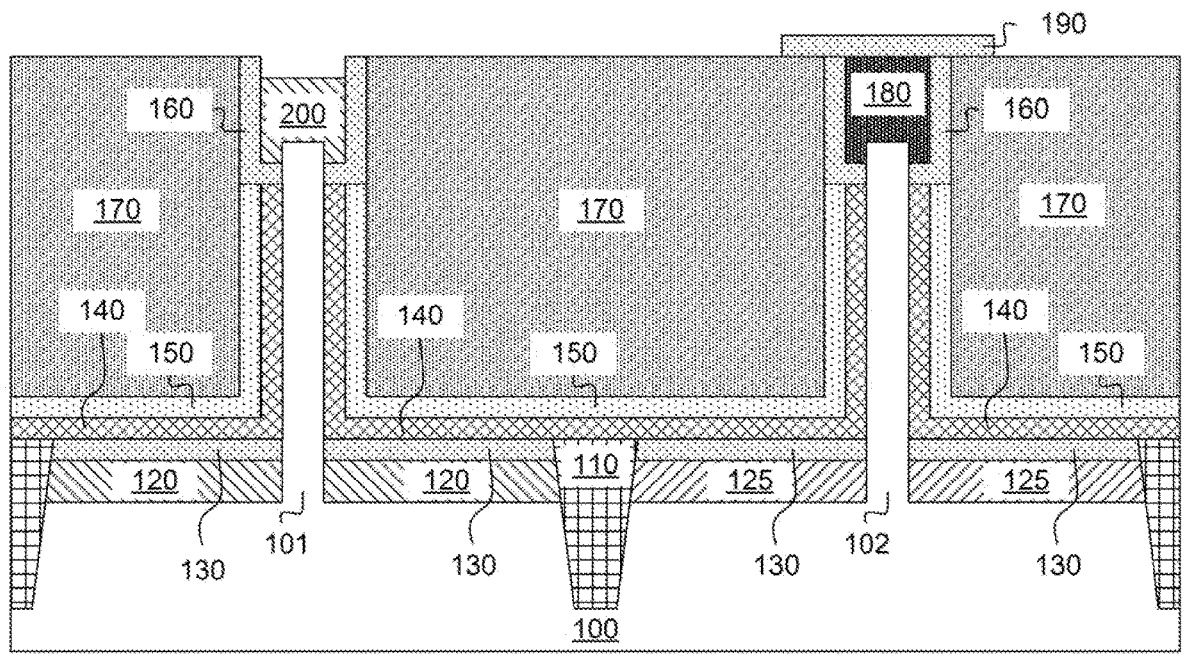
FIG. 3 depicts two VFET structures following removing dummy contact above pFET, structure and growing back the top S/D epitaxy of PFET while the NFET region is covered by a contact mask, according to an example embodiment.

Referring to FIG. 3, forming a contact mask 190, removing the dummy contact 180 above the pFET structure, and forming a first epi contact 200 may occur, according to an example embodiment. Contact mask 190 is formed to cover the dummy contact 180 in the second region 20. Suitable materials for the contact mask 190 include, but are not limited to, nitride materials such as silicon nitride (SixNy), silicon oxynitride (SiON), and/or silicon carbonide nitride (SiCN), and/or oxide materials such as silicon oxide (SiOx). Contact mask 190 may be deposited using any typical techniques, and patterned using a lithographic process followed by etching away unpatterned material.

The dummy contact 180 may be removed by any suitable etching process known in the art capable of selectively removing the dummy contact 180 without substantially removing material from the surrounding structures. In an example embodiment, the dummy contact 180 may be removed, for example, by a reactive ion etching (RIE) process capable of selectively removing silicon. Wet chemistry can also be used to selectively remove the a-Si such as $(NH_4)OH$.

First epi contacts 200 may be grown in the void created by the removal of the dummy contact 180 in the first region 10. First epi contact 200 may be made of any suitable source/drain materials, and may be grown to a height just below the top of the first ILD 170, which may enable formation of a protective cap 215 of sufficient depth to protect the first epi contact 200 from ion implantation. For example, first epi contacts 200 may be about 10 to about 20 nm beneath the top surface of ILD 170, but other distances are contemplated based on the ion implantation processes used. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor. The dopant concentration in the bottom S/D region 106 can range from $1 \times 10^{19}$ $cm^{-3}$ to $2 \times 10^{21}$ $cm^{-3}$, or preferably between $2 \times 10^{20}$ $cm^{-3}$ and $1 \times 10^{21}$ $cm^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon (Si) layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 4:
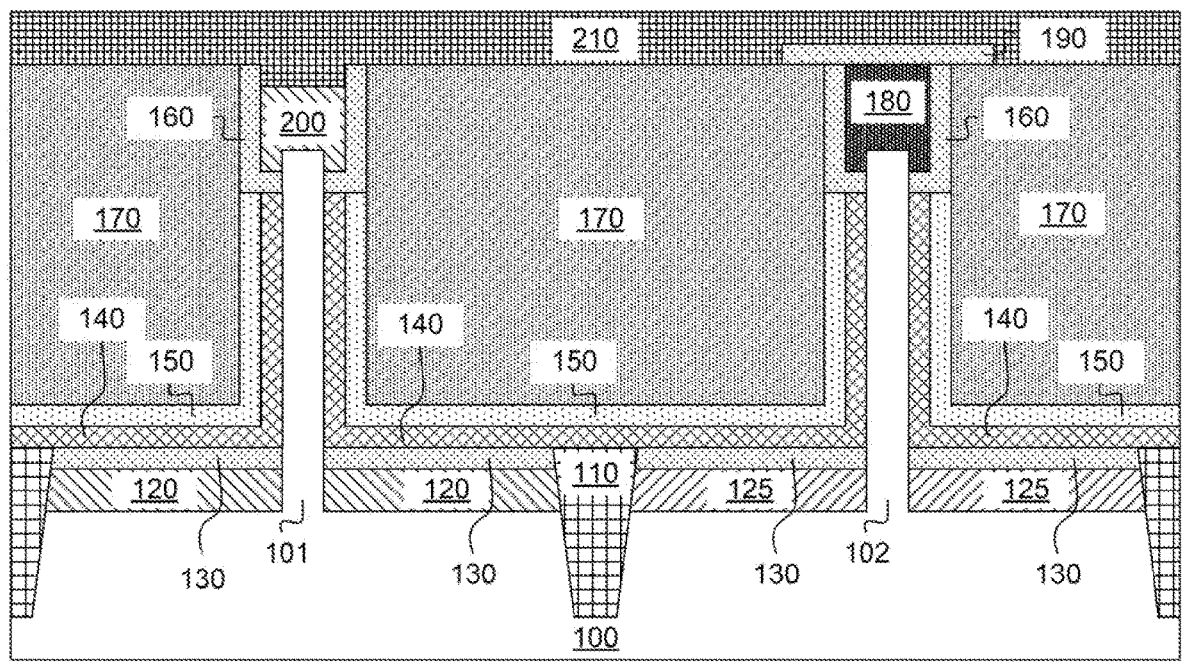
FIG. 4 depicts two VFET structures following deposition of a protective dielectric, according to an example embodiment.

Referring to FIG. 4, deposition of a protective dielectric 210 may occur, according to an example embodiment. The protective dielectric 210 may be selected to be selectively removed with respect to the first ILD 170 and the top spacer 160. The protective dielectric 210 may be formed by, for example, CVD of a dielectric material. Non-limiting examples of dielectric materials to form the protective dielectric 210 may include silicon oxide, silicon nitride, hydrogenated silicon carbon oxide, silicon based low-k dielectrics, flowable oxides, porous dielectrics, or organic dielectrics including porous organic dielectrics. In an example embodiment, the protective dielectric may be Si:C or SiBCN.

Figure 5:
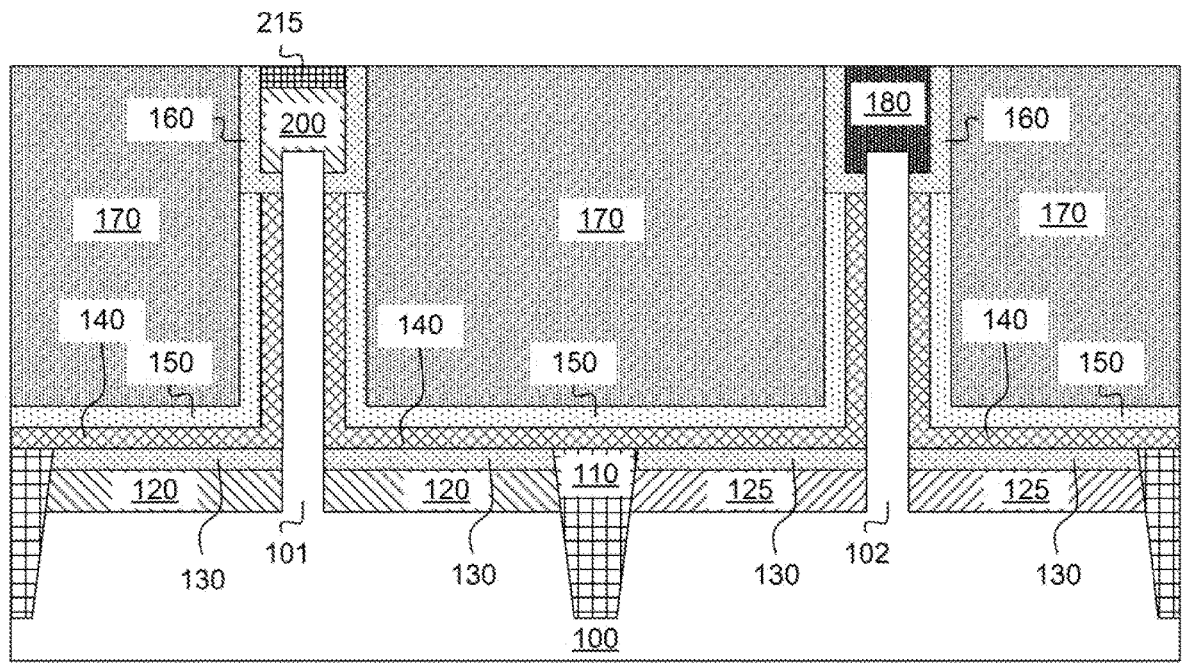
FIG. 5 depicts two VFET structures following chemical mechanical polishing (CMP), according to an example embodiment.

Referring to FIG. 5, chemical mechanical polishing (CMP) may create a protective cap 215 from the protective dielectric 210 above the first epi contact 200, according to an example embodiment.

Figure 6:
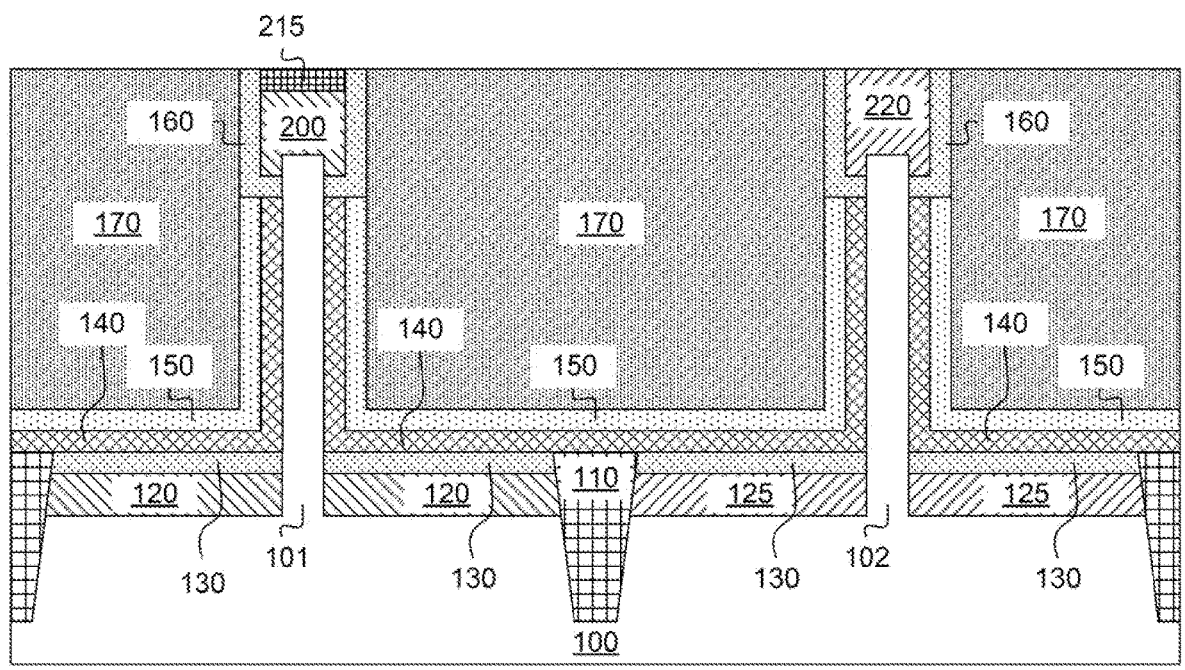
FIG. 6 depicts two VFET structures following removal of the dummy contact above the second region and forming a second epi layer, according to an example embodiment.

Referring to FIG. 6, removal of the dummy contact 180 in the second region 20 may be performed, followed by forming a second epi contact 220, according to an example embodiment. The dummy contact 180 may be removed by any suitable etching process known in the art capable of selectively removing the dummy contact 180 without substantially removing material from the surrounding structures. In an example embodiment, the dummy contact 180 may be removed, for example, by a reactive ion etching (RIE) process capable of selectively removing silicon.

Second epi contact 220 may be grown from gaseous or liquid precursors in the void created by the removal of the dummy contact 180 in the second region 20. Epitaxial materials can be grown using vapor-phase epitaxy (VPE), molecular-beam epitaxy (MBE), liquid-phase epitaxy (LPE), or other suitable process. Epitaxial silicon, silicon germanium, germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor. The dopant concentration in the bottom S/D region 106 can range from $1 \times 10^{19}$ cm$^{-3}$ to $4 \times 10^{21}$ cm$^{-3}$, or preferably between $2 \times 10^{20}$ cm$^{-3}$ and $4 \times 10^{21}$ cm$^{-3}$.

Figure 7:
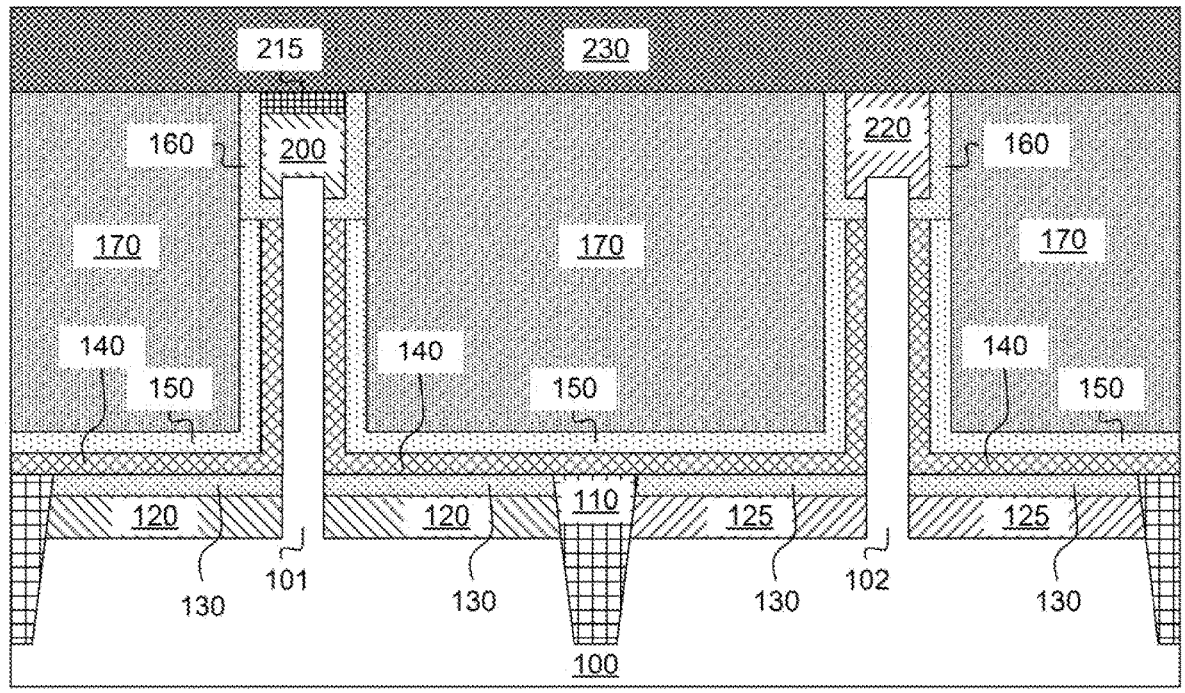
FIG. 7 depicts two VFET structures following deposition of a top dielectric, according to an example embodiment.

Referring to FIG. 7, deposition of a top dielectric layer 230 may occur, according to an example embodiment. The top dielectric layer 230 may be formed by, for example, CVD of a dielectric material. Non-limiting examples of dielectric materials to form the top dielectric layer 230 may include silicon oxide, silicon nitride, hydrogenated silicon carbon oxide, silicon based low-k dielectrics, flowable oxides, porous dielectrics, or organic dielectrics including porous organic dielectrics. After deposition of the top dielectric layer 230, forming a trench using lithographic and etching techniques may be performed to expose a top surface of the first fin 101 and second fin 102.

Figure 8:
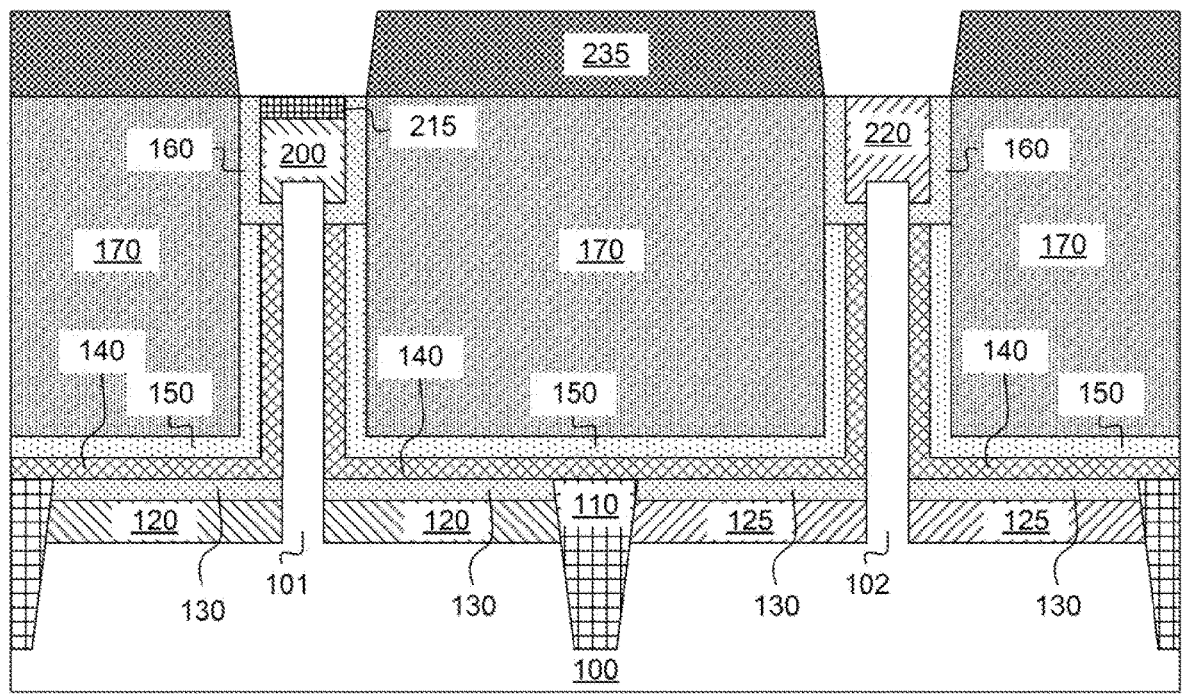
FIG. 8 depicts two VFET structures following forming a trench in the top dielectric, according to an example embodiment.

Referring to FIG. 8, forming a trench in the top dielectric layer 230 above the first epi contact 200 and second epi contact 220 may be performed and result in second ILD 235, according to an example embodiment. After deposition of the top dielectric layer 230, forming a trench using lithographic and etching techniques may be performed, creating second ILD 235, to expose a top surface of the first fin 101 and second fin 102.

Figure 9:
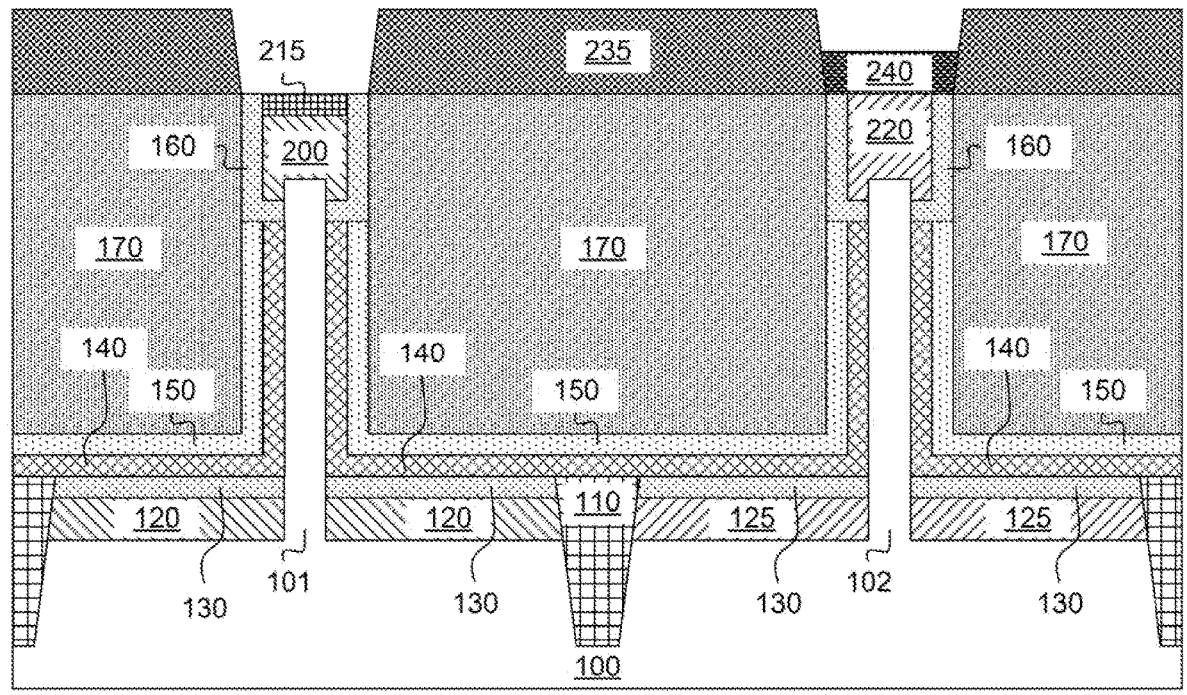
FIG. 9 depicts low energy implantation and selective metal formation in the second region contact, according to an example embodiment.

Referring to FIG. 9, low energy implantation may be performed prior to formation of the second metal contact 240, according to an example embodiment. The ion implantation process may be selected so that the depth of the implantation is not deeper than the protective cap 215. The ion implantation process may be a blanket ion implant. Alternatively, a selective implantation process can be employed wherein a patterned mask, not shown, is used to implant the ions only into the second epi contact 220. Alternatively, a mask can be used that allows for different ions and/or ion concentration to be implanted. The ions are implanted using a conventional ion beam implanter that operates at standard conditions.

The ions are typically implanted at an energy from about 0.5 to about 5 keV using an ion dose from about 5E13 to about 5E15 atoms/cm$^2$. More typically, the ions are implanted at an energy from about 1 to about 2 keV using an ion dose from about 3E14 to about 3E15 atoms/cm$^2$. The implant is typically performed at a substrate temperature from about room temperature to about 200° C., with a substrate temperature of about room temperature being more typical. Note that the ion dose may vary depending on the specific ion being implanted. The energy selected for the implantation of ions is such that most of the ion implants remains in the part of the second epi contact 220 that will be consumed during the silicidation process. Illustrative examples of ions that can be employed in the for nFET materials include but are not limited to: Phosphorus and Arsenic. Illustrative examples of ions that can be employed in the pFET materials include, but are not limited to: Boron, Gallium, and Aluminum.

The second metal contact 240 may be made of, for example, tantalum or tantalum nitride, or titanium and titanium nitride, as adhesion layer for subsequent tungsten deposition, and may include one or more layers of liner material. The second metal contact 240 may be formed using a filing technique such as electroplating, electroless plating, chemical vapor deposition, physical vapor deposition or a combination of methods, which may occur selective on the exposed portion of second epi contact 220. In an example embodiment where the second region 20 include an nFET device, use of a titanium liner may enable selective deposition of titanium to primarily occur on the surface of the second epi contact 220.

Figure 10:
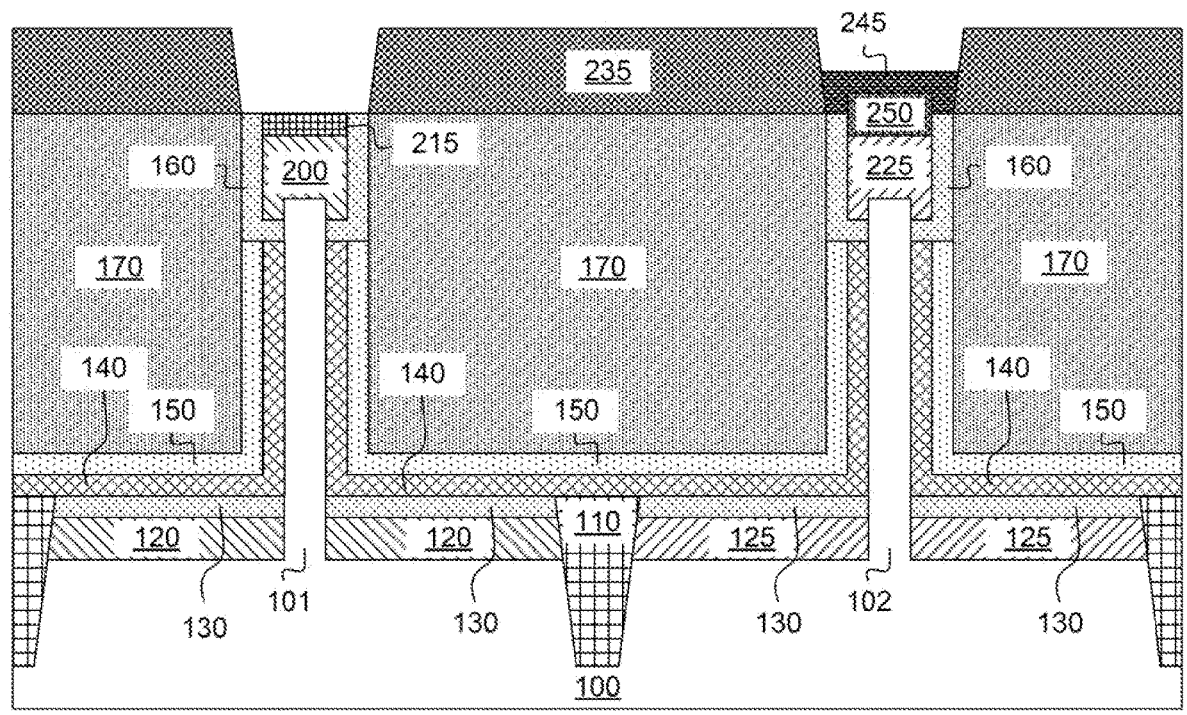
FIG. 10 depicts silicide formation in the second region contact, according to an example embodiment.

Referring to FIG. 10, formation of second silicide 250 from second epi contact 220 and second metal contact 240 may occur, resulting in second epi contact 225 and second metal contact 245, according to an example embodiment. The annealing step used at this point of the present invention to cause second silicide 250 formation is performed at a temperature of about 600° C. or greater. Typically, the anneal is performed at a temperature from about 750° to about 1100° C. The anneal is performed in an inert ambient such as He, Ar, Ne, Kr, Xe, N2 or mixtures thereof such as He—Ar or may be formed in a reducing environment such as H2 or forming gas. The anneal is performed for a time period of sub-milliseconds or greater, with an annealing time from about 10 sec to about 30 min being more typical. The very short time anneal are achieved using laser annealing. The annealing may be performed utilizing a single annealing temperature or multiple annealing temperatures may be used. The annealing may also include various ramp-up cycles, soak cycles, and cool down cycles, as desired.

Figure 11:
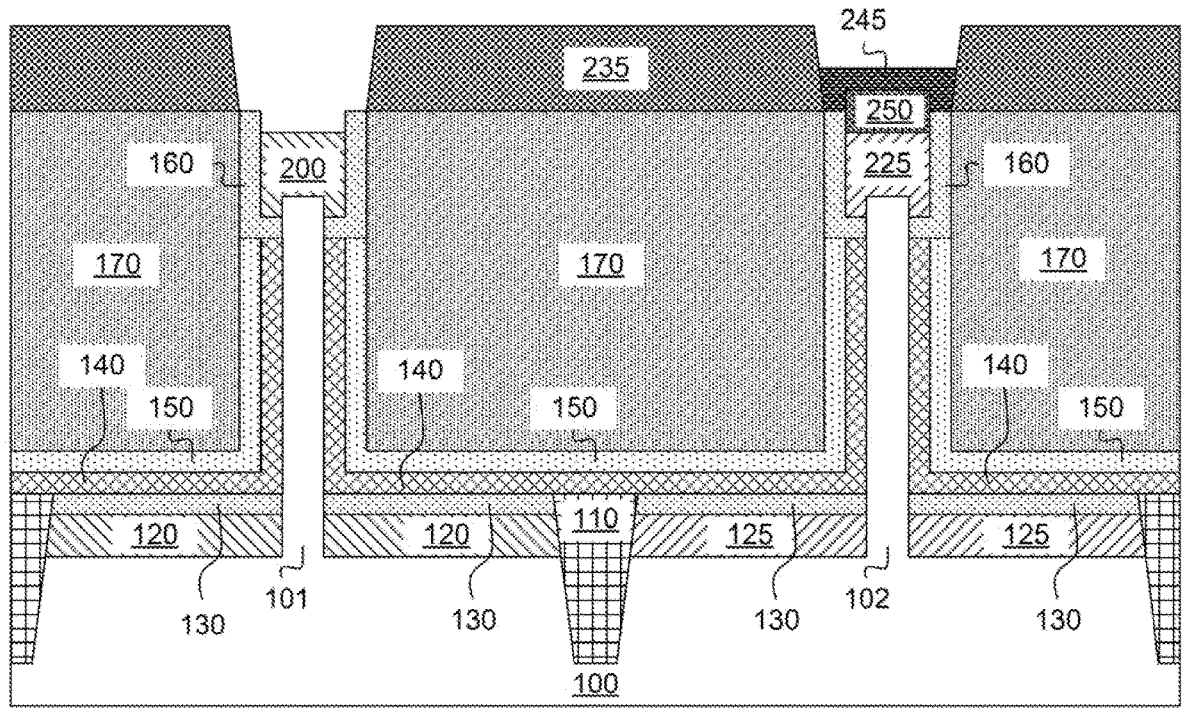
FIG. 11 depicts removal of the protective oxide above the first region contact, according to an example embodiment.

Referring to FIG. 11, removal of the protective cap 215 above the first epi contact 200 may occur, according to an example embodiment. Removal of the protective cap 215 may be performed using any selective etching technique capable of removing the dielectric material used to form the protective cap 215, while retaining the second ILD 235, such as RIE.

Figure 12:
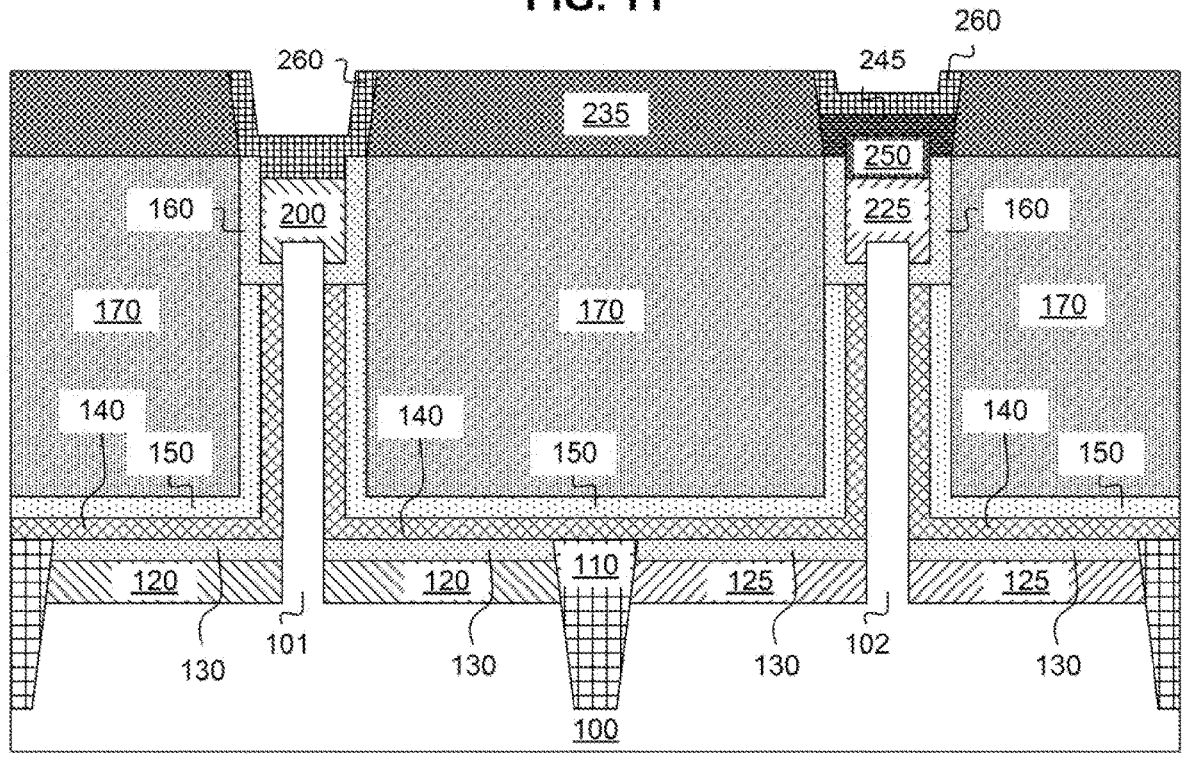
FIG. 12 depicts low energy implantation in the first region contact and contact liner deposition, according to an example embodiment.

Referring to FIG. 12, low energy implantation in the first epi contact 200 and deposition of second contact liner 260 may occur, according to an example embodiment. The ion implantation process may be a blanket ion implant. Alternatively, a selective implantation process can be employed wherein a patterned mask, not shown, is used to implant the ions only into the second epi contact 220. Alternatively, a mask can be used that allows for different ions and/or ion concentration to be implanted. The ions are implanted using a conventional ion beam implanter that operates at standard conditions.

The ions are typically implanted at an energy from about 0.5 to about 5 keV using an ion dose from about 5E13 to about 5E15 atoms/cm$^2$. More typically, the ions are implanted at an energy from about 1 to about 2 keV using an ion dose from about 3E14 to about 3E15 atoms/cm$^2$. The implant is typically performed at a substrate temperature from about room temperature to about 200° C., with a substrate temperature of about room temperature being more typical. Note that the ion dose may vary depending on the specific ion being implanted. The energy selected for the implantation of ions is such that most of the ion implants remains in the part of the second epi contact 220 that will be consumed during the silicidation process. Illustrative examples of ions that can be employed in the for nFET materials include but are not limited to: Phosphorus and Arsenic. Illustrative examples of ions that can be employed in the pFET materials include, but are not limited to: Boron, Gallium, and Aluminum.

The second contact liner 260 may be made of, for example, tantalum or tantalum nitride, or titanium and titanium nitride, as adhesion layer for subsequent tungsten deposition, and may include one or more layers of liner material. The second metal contact 260 may be formed using a filing technique such as electroplating, electroless plating, chemical vapor deposition, physical vapor deposition or a combination of methods, which may occur selective on the exposed portion of second epi contact 220. In an example embodiment where the first region 10 includes a pFET device, the second contact liner 260 may be made a high work function metal such as, for example, Pt, Ni, Pt/Ni. Additionally, an additional TiN or TaN may be deposited to encourage adhesion between the contact 280 and the resulting first metal contact 265.

Figure 13:
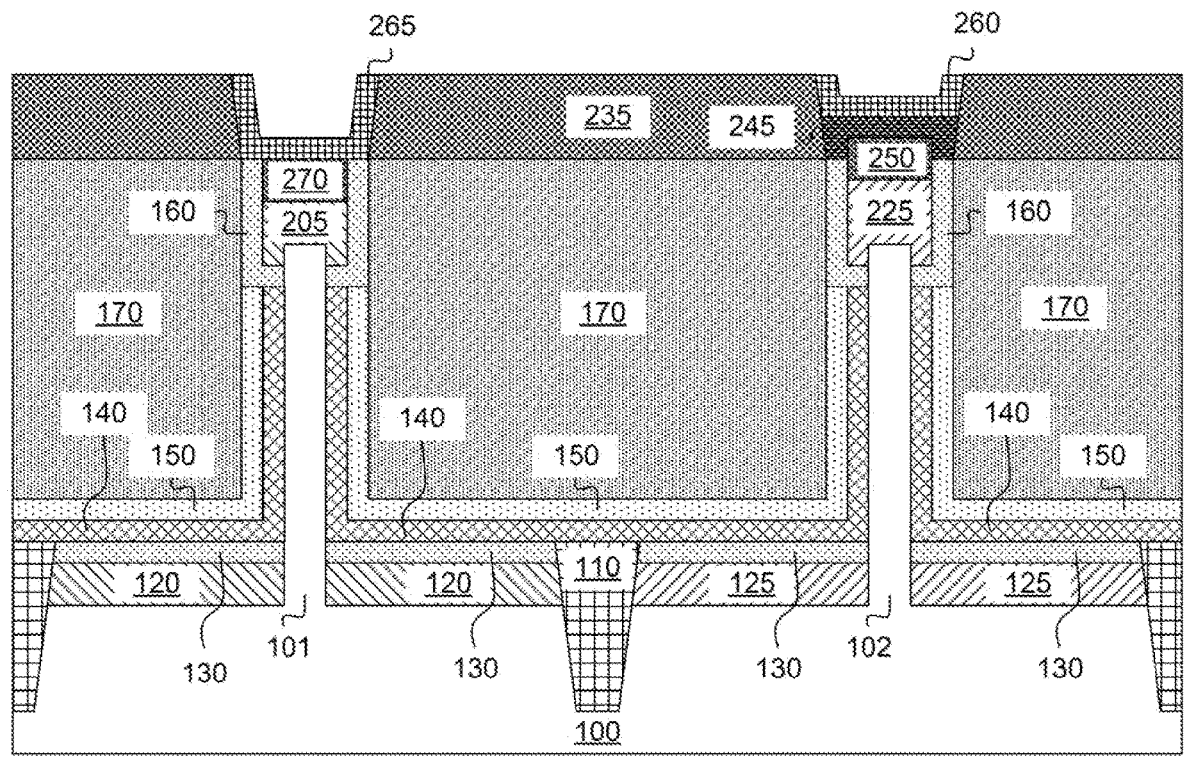
FIG. 13 depicts silicide formation in the first region contact, according to an example embodiment.

Referring to FIG. 13, formation of first silicide 270 from first epi contact 200 and first metal contact 260 may occur, resulting in first epi contact 205 and first metal contact 265, according to an example embodiment. The annealing step used at this point of the present invention to cause first silicide 270 formation is performed at a temperature of about 600° C. or greater. Typically, the anneal is performed at a temperature from about 750° to about 1100° C. The anneal is performed in an inert ambient such as He, Ar, Ne, Kr, Xe, N2 or mixtures thereof such as He—Ar or may be formed in a reducing environment such as H2 or forming gas. The anneal is performed for a time period of sub-milliseconds or greater, with an annealing time from about 10 sec to about 30 min being more typical. The very short time anneal are achieved using laser annealing. The annealing may be performed utilizing a single annealing temperature or multiple annealing temperatures may be used. The annealing may also include various ramp-up cycles, soak cycles, and cool down cycles, as desired.

Figure 14:
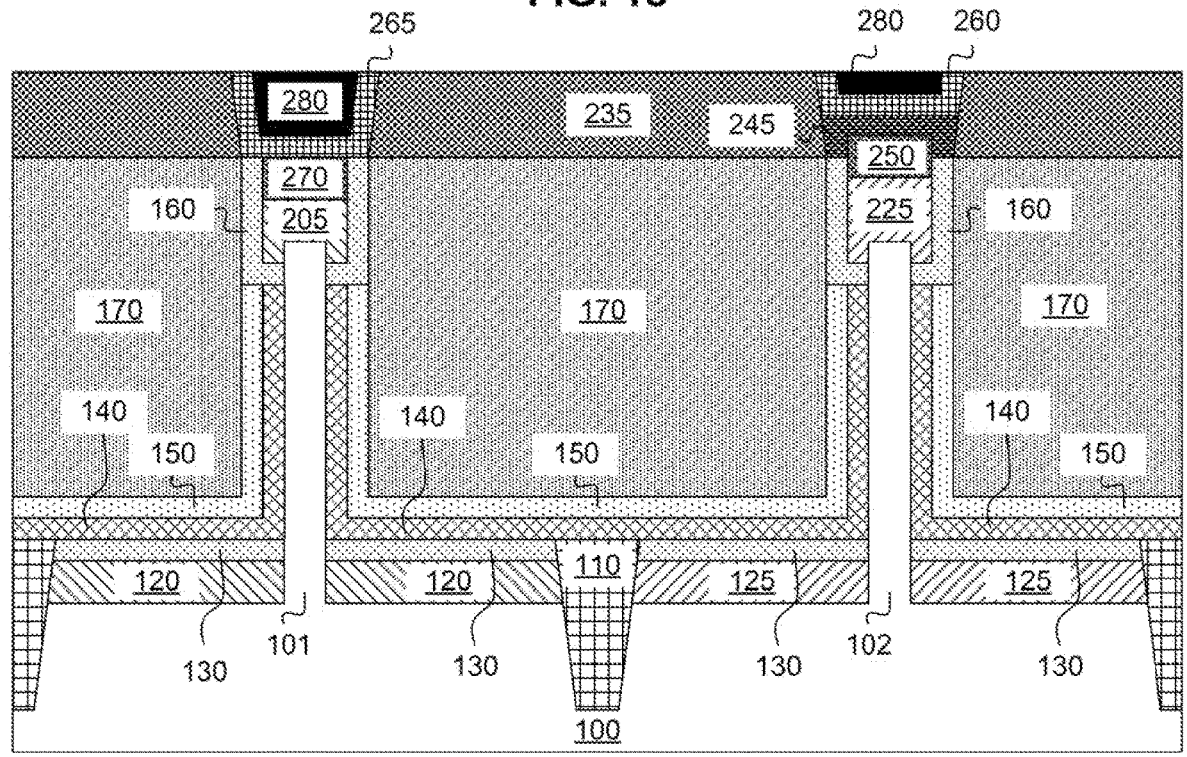
FIG. 14 depicts metal contact deposition, according to an example embodiment.

Referring to FIG. 14, deposition of metal contacts 280 may occur, according to an example embodiment. The metal contacts 280 may include, for example, copper, cobalt, aluminum, or tungsten. The metal contacts 280 may be formed using a filing technique such as electroplating, electroless plating, chemical vapor deposition, physical vapor deposition or a combination of methods, which may occur selectively on the exposed portion, or may be done with a blanket deposition followed by CMP.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention is not limited to the exact forms and details described and illustrated but fall within the scope of the appended claims.

What is claimed is:

1. A semiconductor device comprising:
 a first Vertical Field Effect Transistor (VFET) comprising a first top source drain epi, a first silicide, a first contact liner and a first contact each arranged in direct contact one on top of another, wherein the first silicide consists of elements of the first top source drain epi and the first contact liner; and
 a second VFET comprising a second top source drain epi, a second silicide, a metal contact, a second contact liner and a second contact, wherein the second silicide consists of elements of the second top source drain epi and the metal contact,
 wherein the metal contact is physically arranged between the second silicide from the second contact liner, and wherein a bottommost surface of the metal contact is entirely below a topmost surface of the second silicide, and wherein a bottommost surface of the first contact liner directly contacts a top surface of the first silicide, and wherein the first contact liner and the second contact liner comprise identical elements.

2. The semiconductor device of claim 1, wherein the metal contact surrounds a top and at least two sides of the second silicide.

3. The semiconductor device of claim 1, wherein a bottommost surface of the first contact liner directly contacts a top surface of the first silicide, and wherein a bottommost surface of the first contact liner is above a topmost surface of the first silicide.

4. The semiconductor device of claim 1, wherein the first contact liner physically separates the first silicide from the first contact.

5. The semiconductor device of claim 1, wherein a bottommost surface of the first contact liner is below a bottommost surface of the second contact liner.

6. The semiconductor device of claim 1, wherein the first VFET comprises a pFET, and wherein the second VFET comprises an nFET.

7. The semiconductor device of claim 1, wherein the first contact liner and the second contact liner are both a PFET liner, and the metal contact is titanium.

8. The semiconductor device of claim 1, wherein a width of the first silicide is substantially equal to a width of the first source drain epi, and wherein a width of the second silicide is substantially equal to a width of the second source drain epi.

9. A semiconductor device comprising:
 a first Vertical Field Effect Transistor (VFET) comprising a first top source drain epi, a first silicide, a first contact liner and a first contact, wherein the first silicide comprises elements of the first top source drain epi and the first contact liner; and
 a second VFET comprising a second top source drain epi, a second silicide, a metal contact, a second contact liner and a second contact, wherein the second silicide comprises elements of the second top source drain epi and the metal contact,
 wherein a bottommost surface of the second liner is entirely above a topmost surface of the metal contact, and wherein a bottommost surface of the first contact liner directly contacts a top surface of the first silicide, and wherein the first contact liner and the second contact liner comprise identical elements.

10. The semiconductor device of claim 9, wherein the metal contact surrounds a top and at least two sides of the second silicide.

11. The semiconductor device of claim 9, wherein a bottommost surface of the first contact liner directly contacts a top surface of the first silicide, and wherein a bottommost surface of the first contact liner is above a topmost surface of the first silicide.

12. The semiconductor device of claim 9, wherein the first contact liner physically separates the first silicide from the first contact.

13. The semiconductor device of claim 9, wherein a bottommost surface of the first contact liner is below a bottommost surface of the second contact liner.

14. The semiconductor device of claim 9, wherein the first contact liner and the second contact liner are both a PFET liner, and the metal contact is titanium.

15. The semiconductor device of claim 9, wherein a width of the first silicide is substantially equal to a width of the first source drain epi, and wherein a width of the second silicide is substantially equal to a width of the second source drain epi.

16. A semiconductor device comprising:
- a first Vertical Field Effect Transistor (VFET) comprising a first top source drain epi, a first silicide, a first contact liner and a first contact each arranged one on top of another, wherein the first contact is directly on the first contact liner, the first contact liner is directly on the first silicide, and the first silicide is directly on the first top source drain epi; and
- a second VFET comprising a second top source drain epi, a second silicide, a metal contact, a second contact liner and a second contact each arranged one on top of another, wherein the second contact is directly on the second contact liner, the second contact liner is directly on the metal contact, the metal contact is directly on the second silicide, and the second silicide is directly on the first top source drain epi,
- wherein the first contact liner and the second contact liner comprise identical elements.

17. The semiconductor device of claim 16, wherein the metal contact surrounds a top and at least two sides of the second silicide.

18. The semiconductor device of claim 16, wherein a bottommost surface of the first contact liner is above a topmost surface of the first silicide.

19. The semiconductor device of claim 16, wherein the first contact liner physically separates the first silicide from the first contact.

20. The semiconductor device of claim 16, wherein a bottommost surface of the first contact liner is below a bottommost surface of the second contact liner.

21. The semiconductor device of claim 16, wherein the first VFET comprises a pFET, and wherein the second VFET comprises an nFET.

22. The semiconductor device of claim 16, wherein the first contact liner and the second contact liner are both a PFET liner, and the metal contact is titanium.

23. The semiconductor device of claim 16, wherein a width of the first silicide is substantially equal to a width of the first source drain epi, and wherein a width of the second silicide is substantially equal to a width of the second source drain epi.

* * * * *